United States Patent [19]

Morimoto et al.

[11] Patent Number: 4,724,106
[45] Date of Patent: Feb. 9, 1988

[54] PROCESS FOR FORMING ORGANIC FILM

[75] Inventors: Kiyoshi Morimoto, Mobara; Toshinori Takagi, Nagaokakyo, both of Japan

[73] Assignee: Futaba Denshi Kogyo Kabushiki Kaisha, Mobara, Japan

[21] Appl. No.: 869,810

[22] Filed: May 29, 1986

Related U.S. Application Data

[63] Continuation of Ser. No. 725,169, Apr. 23, 1985, abandoned, which is a continuation of Ser. No. 477,844, Mar. 22, 1983, abandoned.

[30] Foreign Application Priority Data

Mar. 29, 1982 [JP] Japan .................................. 57-49174

[51] Int. Cl.⁴ .............................................. B29C 41/50
[52] U.S. Cl. .................................. 264/24; 204/192.11;
204/192.21; 264/81; 264/83; 425/174.8 E;
427/34; 427/38; 427/41; 427/42
[58] Field of Search ....................... 264/22, 24, 81–83;
427/34, 39–42; 425/174.8 E, 174.8 R; 204/192
N, 192.12, 192.21

[56] References Cited

U.S. PATENT DOCUMENTS

| | | | |
|---|---|---|---|
| 3,406,040 | 10/1968 | DaSilva et al. | 427/42 |
| 3,961,103 | 6/1976 | Aisenberg | 427/34 |
| 4,161,418 | 7/1979 | Morimoto et al. | 427/39 |
| 4,227,961 | 10/1980 | Takagi | 204/192 N |
| 4,242,188 | 12/1980 | Niinomi et al. | 427/39 |
| 4,281,029 | 7/1981 | Takagi et al. | 204/192 N |
| 4,354,909 | 10/1982 | Takagi et al. | 204/192 N |
| 4,394,402 | 7/1983 | Yasuta et al. | 427/41 |

FOREIGN PATENT DOCUMENTS

| | | | |
|---|---|---|---|
| 52-11788 | 1/1977 | Japan | 204/192 N |
| 54-9592 | 4/1979 | Japan | 427/42 |
| 56-147830 | 11/1981 | Japan | 427/34 |
| 56-164019 | 12/1981 | Japan | 427/128 |
| 57-36436 | 2/1982 | Japan | 427/128 |

OTHER PUBLICATIONS

"Organic Film Formation by Cluster Beam Deposition", Usui et al, Isiat Proceedings, 1982, pp. 331–336.

*Primary Examiner*—Jeffery Thurlow
*Attorney, Agent, or Firm*—Oblon, Fisher, Spivak, McClelland & Maier

[57] ABSTRACT

A process for preparing an organic film comprising the steps of ejecting an organic material in a gaseous state from an injection nozzle into a vacuum region to form clusters due to adiabatic expansion, subjecting the clusters to an intermediate state necessary for forming polymers due to abstraction and the like occurring in a part of atoms forming the clusters, and effecting polymerization reaction of the clusters on a substrate, thereby to form a dense organic film of a high quality and a high bonding strength.

12 Claims, 13 Drawing Figures

2θ (deg.)

ADHESION STRENGTH (g/cm²)

ADHESION STRENGTH (g/cm²)

PROCESS FOR FORMING ORGANIC FILM

This application is a continuation of application Ser. No. 725,169, filed Apr. 23, 1985, now abandoned, which is a continuation of application Ser. No. 477,844, filed Mar. 22, 1983 now abandoned.

BACKGROUND OF THE INVENTION

1. Field of the Invention

This invention relates to a process for forming an organic film, and more particularly to a process for forming a dense organic film having a high quality and a high bonding strength and having various physical and chemical properties controlled as desired.

2. Description of the Prior Art

The formation of an organic film on various kinds of substrates has been conventionally carried out utilizing a mechanical method such as a method of applying on a substrate a film prepared by extruding or stretching a thermoplastic material or a thermal method such as a method of baking an organic solution applied on a substrate. Unfortunately, the conventional mechanical and thermal methods are not adapted to form an organic film of several microns or less in thickness which is homogeneous and has a high adhesion strength. In view of the foregoing, there have been recently proposed some methods such as a plasma method, a vacuum deposition method and the like for the formation of such a film. The plasma method is to deposit an organic material on a substrate disposed in a plasma atmosphere formed by carrying out glow discharge in a vapor of an organic monomer having a low pressure, to thereby form an organic film on the substrate.

However, the plasma method has a disadvantage that it is substantially impossible to prevent the inclusion of a gaseous material introduced to form a plasma and/or other impurities into the film during the formation. Also, there is a fear that revaporization of such gas or impurities often occurs. Another disadvantage encountered with the plasma method is that it is difficult or substantially impossible to externally control operational conditions for forming an organic film and more particularly to externally set and vary the conditions as desired. The plasma method has a further disadvantage of causing undesired heating due to impingement of electrons. Thus, the conventional plasma method cannot be used to form an organic film of a high quality with good reproducibility.

The vacuum deposition method has been proposed, for example, to form an organic semiconductor film from acetylene. However, the so-formed semiconductor is easy to peel due to its poor adhesion strength. This method is also directed to the formation of a thin ployethylene film on a substrate, however, the polyethylene film cannot adhere to the substrate because its bonding strength is substantially zero. Thus, the vacuum deposition method has not been put into practical use for the formation of an organic film.

BRIEF SUMMARY OF THE INVENTION

The present invention has been made in view of the foregoing disadvantages of the prior art while taking notice of the fact that cluster beam deposition techniques proposed by the inventors effectively accomplish the formation of an organic film having a high quality and adhesion strength high enough to securely adhere to a substrate.

Accordingly, it is an object of the present invention to provide a process for forming an organic film having a high quality and a high adhesion strength, wherein an organic material is vaporized in a closed type crucible with at least one injection nozzle which is disposed in a high vacuum region of a pressure of one-hundredth as high as a vapor pressure within the crucible, to thereby form a vapor of the organic material. The organic material vapor is ejected through the injection nozzle into the vacuum region to be expanded adiabatically so as to attain a supercooled state to form aggregates or clusters comprising atoms of the ejected organic material vapor. When the so-formed clusters are transported to a substrate with kinetic energy imparted to the clusters at the time of the injection from the injection nozzle or kinetic energy imparted thereto by ionizing at least a part of the clusters and accelerating or decelerating the ionized clusters by means of an electric field or when the clusters impinge on the substrate, a part of atoms forming the clusters is subjected to abstraction, breaking, cleavage, recombination and the like to allow an intermediate state of the organic material to appear which is necessary to form an organic polymer. Then, the clusters are polymerized and/or polycondensated on the substrate to form an organic thin film of a high quality and a high bonding strength with respect to the substrate.

It is another object of the present invention to provide a process for forming an organic film which is capable of effectively preventing the inclusion of an impurity and the like in a film during the formation to prepare a high quality of an organic film.

It is a further object of the present invention to provide a process for forming an organic film which is capable of controlling conditions for forming an intermediate state of clusters to form an organic film having physical and chemical properties controlled as desired.

It is still a further object of the present invention to provide a process for forming an organic film which is capable of varying kinetic energy imparted to clusters formed, to thereby substantially increase adhesion strength of an film with respect to a substrate.

In accordance with the present invention, there is provided a process for forming an organic film which comprises the steps of ejecting an organic material in a gaseous state from an injection nozzle into a vacuum region to decrease a pressure of the organic material below one-hundredth to expand adiabatically the material, so that a supercooled state of the organic material may be attained to form clusters comprising atoms of at least a part of the organic material, and permitting the clusters to impinge on a substrate with kinetic energy imparted to the clusters to form an organic film deposited on the substrate.

BRIEF DESCRIPTION OF THE DRAWINGS

Other objects and many of the attendant advantages of this invention will be readily appreciated as the same becomes better understood by reference to the following detailed description when considered in connection with the accompanying drawings, in which like reference characters designate the same or similar parts throughout the figures thereof and wherein.

DETAILED DESCRIPTION OF THE PREFERRED EMBODIMENTS

Now, a process for preparing an organic film according to the present invention will be hereinafter described with reference to the accompanying drawings.

Figure 1:
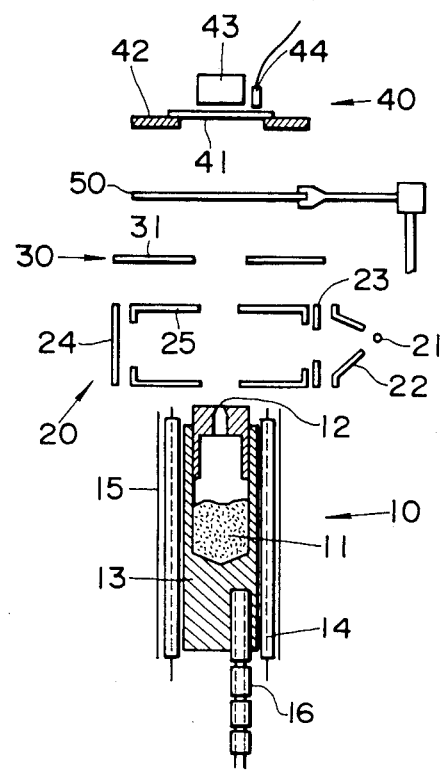
FIG. 1 is a schematic view showing the essential part of an apparatus adapted to be used for practicing one embodiment of a process for forming on organic film according to the present invention.

FIG. 1 schematically shows the essential part of a cluster beam deposition apparatus adapted to be used in one embodiment of the formation of an organic thin film according to the present invention. The apparatus of FIG. 1 is adapted to ionize a part of clusters in order to allow an intermediate state of an organic material used in the present invention to efficiently appear which is necessary to form an organic polymer. The apparatus comprises four main sections, more particularly, a crucible section 10 for receiving, heating and vaporizing an organic material 11 therein to form a vapor of the organic material, an ionization chamber section 20 for ionizing a part of clusters of the organic material, an accelerating electrode section 30 for accelerating the ionized clusters and a holder section 40 for holding a substrate on which an organic film is to be formed. The nozzle section 10 includes a closed type crucible 13 with at least one injection nozzle 12 having the organic material 11 received therein of which a thin film to be formed. In FIG. 1, the crucible 13 is shown to have one injection nozzle 12. The crucible section 10 also includes a heater 14 for heating the crucible 13 to vaporize the organic material 11, a shielding plate 15 for surrounding the heater 14 and a thermocouple 16 for measuring a temperature within the crucible 13 as required. The most important matter in construction of the crucible section 10 is to form the injection nozzle 12 so that it may meet requirements necessary to form a cluster beam from the organic material vapor.

More particularly, clusters, as described hereinbefore, are formed by aggregating particles of the organic material vapor due to supercooling of the vapor attained by adiabatic expansion of the vapor caused when the vapor in the crucible disposed in a high vacuum region is ejected through the injection nozzle into the vacuum region. Thus, in order to form the clusters, it is required to carry out the interchanges of kinetic energy between the vapor particles at the time of ejecting the vapor through the nozzle. This is accomplished by rendering a diameter of the injection nozzle 12 substantially larger than mean free path of the vapor particles within the crucible 13. Further, effective formation of the clusters requires a substantial pressure difference between an exterior of the crucible and an interior thereof. For this purpose, it is desired that the ratio of the thickness l of the injection nozzle 12 to the diameter d thereof or the aspect ratio l/d be 1. In view of the foregoing, effective clusters can be formed by permitting the injection nozzle 12 to have a diameter of 0.5–2.0 mm supposing that the vacuum region surrounding the crucible 13 has a pressure of $10^{-7}$–$10^{-3}$ Torr which is readily obtained by a conventional vacuum system and a vapor pressure within the crucible 13 is $10^{-1}$–10 Torr.

The ionization chamber section 20 is adapted to irradiate electrons with respect to the clusters ejected from the injection nozzle 12 to ionize one of particles forming the cluster. Such ionization chamber section 20 may be constructed in various ways. In the apparatus of FIG. 1, the ionization chamber section 20 includes an electron source 21 of the filament type emitting electrons, for example, thermions when heated, a converging electrode 22, an anode 23 and a collection electrode 24 for collecting the electrons. An ionization space of the section 20 is surrounded by a cage 25.

The acceleration electrode section 30 comprises at least one acceleration electrode 31.

The holder section 40 includes a holder 42 suitable for holding a substrate 41 in position on which an organic thin film is to be formed, a means 43 for heating or cooling the substrate 41 according to the conditions under which a film is formed of the organic material 11, and a thermocouple 44 for measuring a tempeature of the substrate 41. Reference numeral 50 desginates a shutter for preventing the clusters from impinging on the substrate 41 when the impingement is not desired.

Figure 2:
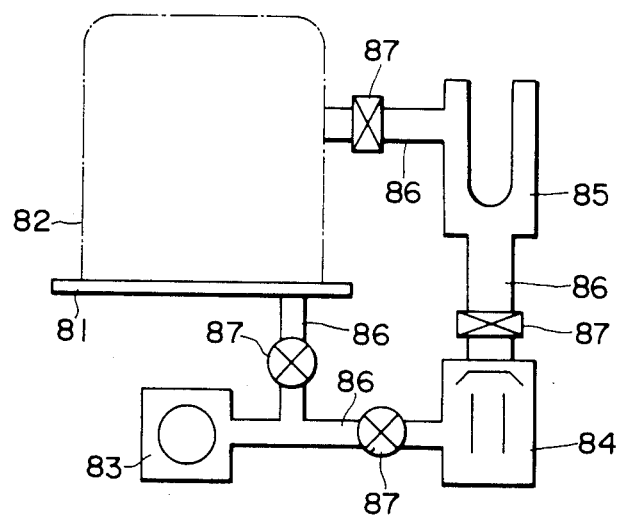
FIG. 2 is a schematic view showing one example of a vacuum system adapted to be used for the apparatus shown in FIG. 1.

The cluster beam deposition apparatus constructed in the manner as described hereinbefore is enclosed in a vacuum casing schematically shown in FIG. 2 so as to be maintained at a high vacuum. The heater 14, electron source 21 and electrodes are electrically connected to a power source (not shown).

A vacuum system of allowing the apparatus of FIG. 1 to be maintained at a high vacuum may be constructed in various ways. FIG. 2 shows an example of such vacuum system, which is connected to the vacuum casing shown in chain lines. The vacuum casing comprises a base 81 and a bell jar 82 hermetically placed on the base 81 to form a high vacuum atmosphere therein, in which the apparatus shown in FIG. 1 is received and maintained at a high vacuum. The vacuum system may be constructed in such a manner as known in the art. For example, the vacuum system, as shown in FIG. 2, may be constructed to include a rotary pump 83, a diffusion pump 84 and a cold trap 85 and be connected through an evacuation pipe 86 to the vacuum casing. The vacuum system is also provided with valves 87 such as a main valve, a roughing valve and the like in position. The cold trap 25 has a liquid nitrogen received therein and is connected between the diffusion pump 84 and the bell jar 82.

Now, results of an energy analysis showing the fact that clusters have been effectively formed of an organic material using the appratus shown in FIG. 1 will be hereinafter described in detail.

Materials for an organic film prepared according to the present invention include specific high-molecular weight materials such as, for example, anthracene (molecular formula: $C_{14}H_{10}$) marked for the reason that it is suitable for use as a material for an organic semiconductor as well as general high-molecular weight materials such as polyethylene. The following description will be made in connection with an example wherein anthracene is used as a material for an organic thin film which was substantially impossible to form a dense film of a high bonding strength according to the conventional methods such as, for example, the plasma method, the vacuum deposition method and the like mentioned hereinbefore.

An anthracene monomer material 11 was charged and heated in the crucible 13 to form its vapor and ejected in a vapor state from the injection nozzle 12 in the high vacuum region of $10^{-7}$-$10^{-3}$ Torr in pressure to form clusters. A part of the clusters was then ionized in the ionization chamber 20. Thereafter, the ionized clusters were introduced into an energy analyzer of a sector shape having an angle of 127° and subjected to an energy analysis. The results are shown in FIG. 3.

In this analysis, the injection nozzle 12 was used which has dementions of 1 mm in diamter and 1 mm in thickness, ionization voltage and current in the ionization chamber 20 were set at 15 V and 50 μA, respectively, and the acceleration electrode section 30 was applied thereto an acceleration voltage of 50 V.

Figure 3:
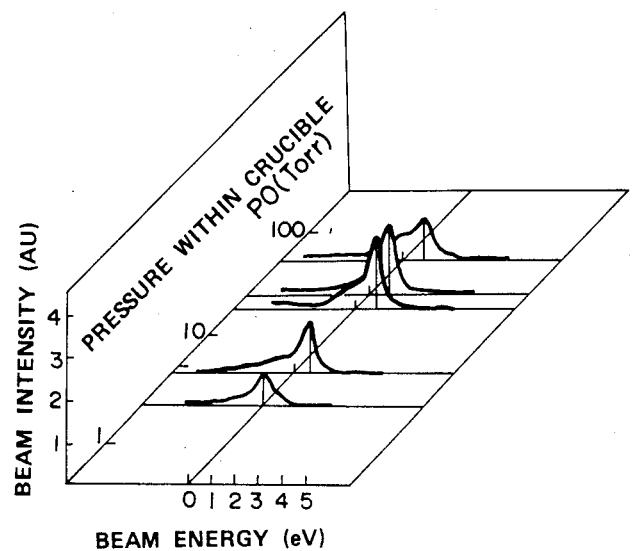
FIG. 3 is a view showing results of energy analysis of a beam ejected from an injection nozzle of the apparatus shown in FIG. 1.

As can be seen from the results shown in FIG. 3, a peak of high beam intensity begins to appear when the crucible 13 is heated by the heater 14 to increase a vapor pressure Po in the crucible 13 to about 1 Torr. This means that the vapor in the crucible 13 is supercooled due to adiabatic expansion at the time of the ejection from the nozzle to initiate the formation of clusters. When the crucible is further heated to increase the vapor pressure in the crucible to about 30 Torr, the beam intensity reaches maximum and an energy at this time becomes 1-2 eV.

More particularly, the results clearly show that clusters start to be formed at the time when the vapor pressure Po in the crucible 13 becomes about $10^2$ times as much as a pressure P of the vacuum region and more effective clusters are formed at the pressure Po of $10^3$-$10^4$ times as much as the pressure P. On the basis of a thermal energy within the crucible 13 in view of such results and particle characteristics of the cluster beam ejected from the injection nozzle 13, it is estimated that 5-200 anthracene molecules will form a cluster or a cluster-like aggregate.

Now, characteristics of an organic film which was actuatlly prepared from anthracene on the basis of the results of energy analysis described above will be explained.

Figure 4:
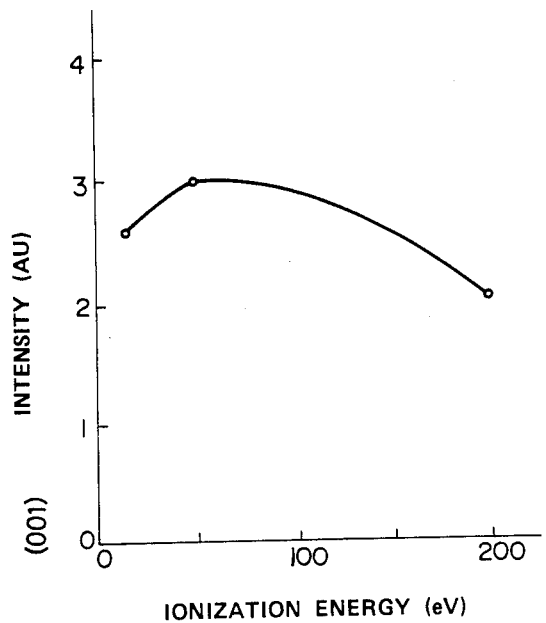
FIG. 4 is a graphical view showing the relationships between a ionization energy and a diffraction intensity in the direction of (001) in connection with an organic film prepared in one embodiment of the present invention.
Figure 5:
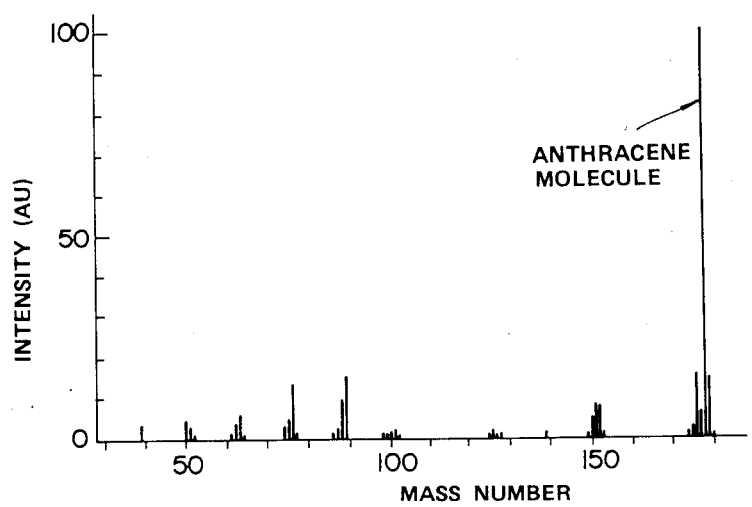
FIG. 5 is a chart view showing results of a quantitative spectral analysis of an organic film prepared in one embodiment of the present invention.

In preparation of the organic film, the apparatus shown in FIG. 1 was operated under the following conditions. A heating temperature of the crucible 13 by the heater 14 was set at 180° C. in view of the above-mentioned results of energy analysis indicating that it is required to set a ratio (Po/P) between the pressure Po within the crucible and the ambient pressure P above $10^2$, preferably $10^4$. A voltage applied to the anode 23 in the ionization chamber 20 or an ionization voltage, as seen from FIG. 4 showing results of an experiment as to the dependence of diffraction intensity of an anthracene film obtained by an X-ray diffraction on an ionization voltage, is desired to be determined between several tens V and 300 V. This is also proved by FIG. 5 showing results of a quantitative spectral analysis of an anthracene film formed when the ionization voltage is set at 70 V. More particularly, FIG. 5 clearly shows that when the ionization voltage is set as high as about 50-70 V, a high spectral intensity is obtained where the mass number of anthracene is 170-180. According, it can be seen that an ion of anthracene molecule (molecular weigh: 178) has been surely formed. Thus, it is proved that an intermediate state of anthracene necessary to form an anthracene polymer appears due to abstraction, breaking, cleavage and/or recombination of anthracene molecule and the like. In view of these respects, the ionization voltage was set at 50 V in the present embodiment.

It will be noted that such value of the ionization voltage is low as compared with an ionization voltage in a convetnional deposition procedure of depositing a cluster ion beam to form a metal or semiconductor film. This would be due to the fact that a high-molecular weight compound such as an organic material has bound-electrons of a low energy as compared with a lone atom, so that it may be ionized with a low energy. Also, in formation of the anthracene film, an ionization current flowing from the electron source 21 to the collection electrode 24 is as low as several tens mA, thus, it will be noted that it is lower than in the formation of a metal film. In the present embodiment, the ionization current was set at 10 mA.

An acceleration voltage applied to the acceleration electrode section 30 is preferably between 100 V and 500 V. The acceleration voltage was set at 200 V in the embodiment.

A temperature of the substrate 41 was kept at −10° C. by the heating and cooling means 43 to prevent the revaporization of clusters having reached the substrate.

The organic material 11 heated and vaporized in the crucible 13 is ejected through the injection nozzle 12 into the high vacuum region to be expanded adiabatically so as to attain a supercooled state, to thereby form clusters comprising atoms of vapor of the organic material. In this instance, it is not necessarily required that the entire organic material vapor forms clusters at the time of the ejection from the nozzle, and a part of the vapor may be ejected in a form of molecule.

The so-formed clusters and molecules are introduced into the ionization chamber section 20 with kinetic energy imparted thereto at the time of the injection from the injection nozzle 12. The clusters and molecules are exposed to a shower of electrons emitted from the electron source 21 to be partially ionized and accelerated in the direction of the substrate 41 by an electric field provided by the acceleration electrode section 30.

A beam including ionized clusters, neutral clusters, and molecules impinges on the surface of the substrate to form an anthracene thin film deposited thereon.

In such case, kinetic energy imparted to the clusters at the time of the ejection from the injection nozzle 12 or kinetic energy imparted thereto by the acceleration electric field allows a part of atoms forming the clusters to be subjected to abstraction, breaking, cleavage or recombination during the transportation to the substrate 41 or at the time of the impingement on the substrate to generate radical, so that an intermediate state of the clusters may appear which is necessary to cause polymerization and/or polycondensation or form polymers. Appearance of the intermediate state allows a dense organic film of a high adhesion strength to be formed in cooperation with specific effects of the cluster or ionized clusters such as sputtering and cleaning effects occurring at the time of the impingement on the substrate, an etching effect with respect to the surface of the substrate, an effect of promoting the formation of nuclei at the initial state of forming a film, a surface migration effect that clusters are broken to migrate on the surface of the substrate when particles of the beam impinge on the substrate, to thereby contribute to the formation of a good quality of organic film, and the like.

Among many advantages of the present invention, one of the essential features is that the formation of intermediate state of the clusters necessary to form a polymer can be externally controlled in view of a material 11 to be used, as desired.

More particularly, conditions under which the radical is formed vary dependent upon a material 11 to be used, as will be known in the art. The present invention is adapted to allow a temperature in the crucible 13 heated by the heater 14, ionization voltage and current in the ionization chamber section 20, a temperature of the substrate 41 heated or cooled by the means 43 and the like to be externally controlled as desired. Thus, it is possible to readily set optimal conditions in view of a material to be used, as desired.

For example, the present invention is capable of accelerating an ionization current to a level necessary to generate ion or radical of the clusters by an ionization voltage to carry out a desired reaction on the substrate. Also, in the present invention, it is possible to set an acceleration voltage applied to the acceleration electrode section 30 at an optimum value to form a desired organic film. Thus, it will be noted that the present invention is capable of forming a desired thin film provided with physical properties such as electrical conductivity, thermal conductivity, magnetic property and the like and chemical properties such as hygroscopicity and the like which can be controlled as desired.

Now, characteristics of an anthracene film formed under such conditions as described above will be described with reference to FIGS. 6 to 12.

Figure 6:
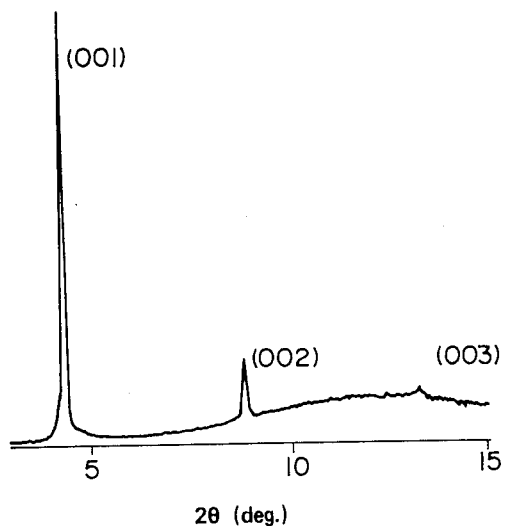
FIG. 6 is a chart view showing the distribution of spectrum of an X-ray diffraction of an organic film prepared in one embodiment of the present invention.
Figure 7:
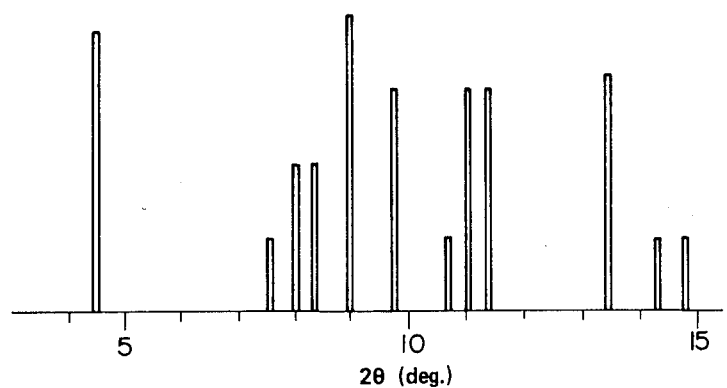
FIG. 7 is a chart view showing the distribution of spectrum of an X-ray diffraction of a powderly organic material used in one embodiment of the present invention.

FIG. 6 shows a spectral distribution of an X-ray diffraction of an anthracene film prepared according to the process of the present invention. As can be seen from FIG. 6, the anthracene film is orientated in the direction of (001). For the purpose of comparison, a sample of anthracene which was used as a starting material in the present embodiment was subjected to an X-ray diffraction analysis, results of which are shown in FIG. 7. FIGS. 6 and 7 reveal that an organic film was effectively formed which has a good orientation, this meaning that the present invention is highly effective to prepare a film for an organic semiconductor, such as an antracene thin film.

Figure 8:
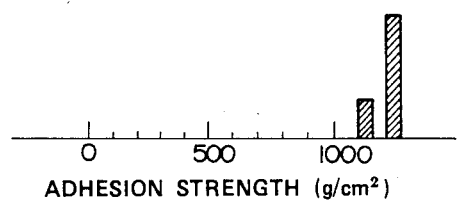
FIGS. 8 and 9 are graphical views showing bonding strength of organic films formed under the conditions different from each other in one embodiment of the present invention, respectively.
Figure 9:
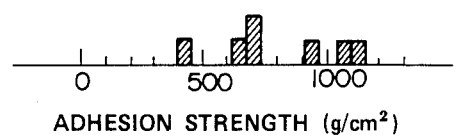

A bonging strength of the so-formed anthracene film with respect to the substrate 41 is shown in FIG. 8. It is known in the art that a bonding strength of an anthracene film deposited on a substrate according to the conventional vacuum deposition techniques is almost zero or at most several tens g/cm$^2$. On the contrary, the present invention, as apparent from FIG. 8, is capable of preparing an anthracene film having a uniform and high bonding strength of 1000 g/cm$^2$ or more. Also, in the present invention, it is possible to carry out, in the state of stopping the ionization in the ionization chamber 20, the deposition of clusters only with kinetic energy imparted thereto at the time of the ejection from the injection nozzle 12. Such stopping of ionization indicates that the acceleration in the acceleration electrode section 30 does not take place. The discribution of bonding strength of the film in such case is shown in FIG. 9. It is noted that a bonding strength of the film formed under the conditions of stopping the ionization is between about 400 g/cm$^2$ and 1000 g/cm$^2$. Thus, it should be understood that the present invention is capable of significantly accomplishing improvement in bonding strength even in such case, as compared with the conventional vacuum deposition method, although the distribution of bonding strength is somewhat nonuniform. It is a matter of course that the so-formed film can be fully put into practical use in view of its applications.

The invention further conducted measurement of a photoluminescence spectrum of an organic film prepared according to the present invention in order to confirm if a polymerization and/or polycondensation reactions was carried out on the surface of the substrate 41.

Figure 10:
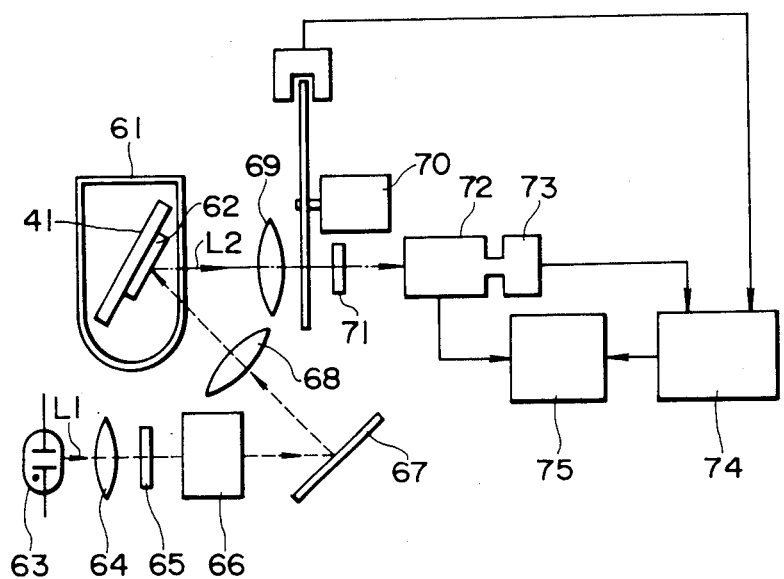
FIG. 10 is a block diagram showing a circuit for measuring photoluminescence spectrum of an organic film prepared in one embodiment of the present invention.

An apparatus used in such measurement is diagramatically shown in FIG. 10, wherein reference numeral 61 designates a liquid nitrogen cryostat having an anthracene film 62 to be measured received therein. The apparatus of FIG. 10 is constructed in a manner to expose the film 62 to light $L_1$ emitted from an excitation light source 63 such as a mercury lamp and supplied through an optical system 64, a filter 65, a copper sulfate solution tank 66, a reflecting mirror 67 and a lens system 68 to excite the film. Light $L_2$ obtained due to such excitation is introduced through a stopped-down lens system 69 into a chopper section 70 and then input through a filter 71 to a spectroscope 72. The light $L_2$ is then changed into an electric signal by a photomultiplier tube 73 and subsequently amplified together with a chopper signal supplied from the chopper section 70 by a lock-in amplifier 74. The amplified electric signal is finally recorded together with a signal from the spectroscope 72 by a recorder 75.

Figure 11:
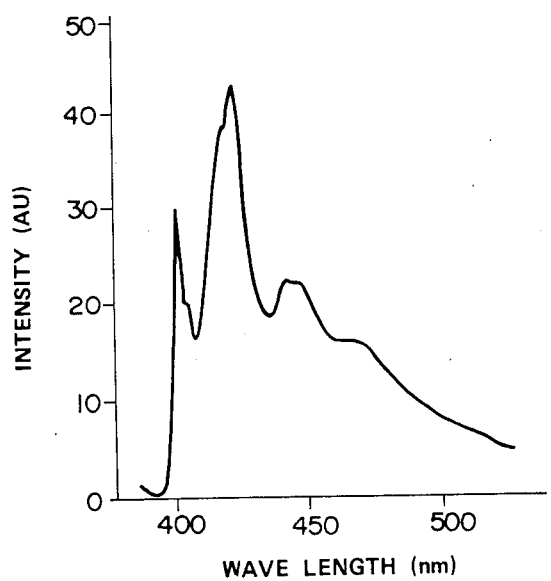
FIGS. 11 and 12 are graphical views showing photoluminescence spectrum of organic films prepared under the conditions from each other in one embodiment of the present invention.

An example of photoluminescence spectrum obtained by the apparatus of FIG. 10 is shown in FIG. 11. The spectrum shown in FIG. 11 is a typical photoluminescence spectrum of an anthracene. This clearly shows that the organic film is formed of anthracene and polymerization and/or polycondensation reaction of an anthracene was surely carried out on the surface of the substrate 41.

Figure 12:
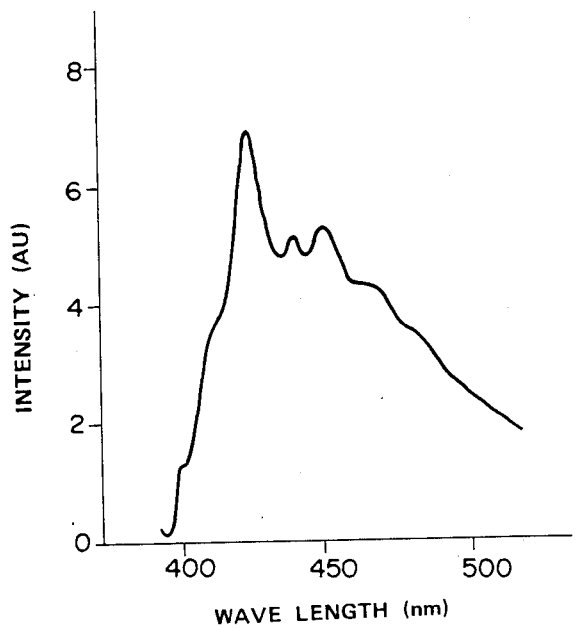

Further, FIG. 12 shows a photoluminescence spectrum of an organic film obtained from anthracene by substantially increasing a voltage applied to the acceleration electrode section 30 to 2000 V while keeping the other depositing conditions constant. The spectrum is a typical spectrum of anthanthrene (molecular formula: $C_{22}H_{12}$). Thus, it can be seen that such conditions allow an anthanthrene film to be formed.

In view of the foregoing, it will be noted that the process of the present invention is capable of adjusting an intermediate state of the clusters necessary to form a polymer to control various physical and chemical properties of an organic film formed, as desired. It is of course that formation of the radical may be controlled by varying the ionization conditions in the ionization chamber section 20 or a temperature of the crucible 13 heated as well as varying the acceleration voltage as mentioned above.

Thus, according to the present invention, it is possible to determine the optimal conditions under which an organic film can be formed having a good quality and a high bonding strength with respect to a substrate. Accordingly, the present invention allows the coating of an organic material on various kinds of substrates to be accomplished and an organic semiconductor having a crystal structure and a composition favorably affecting its quality and the like to be formed. This results in an organic film prepared according to the present invention having at least the same quality as the experimentally obtained by a conventional pull method.

The embodiment as explained hereinbefore is adapted to use a powder material as the organic material 11. Nevertheless, it is a matter of course that monomers of liquid or solid at an ordinary state which is polymerized and/or polycondesated to form polymers may be used as a starting material for an organic film formed according to the present invention.

Figure 13:
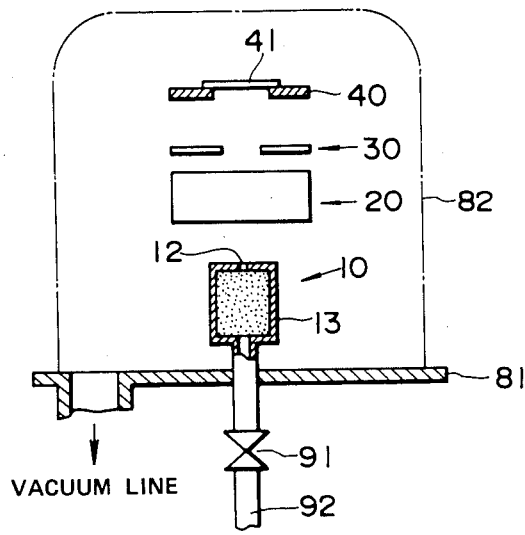
FIG. 13 is a schematic view showing the essential part of an apparatus adapted to be used for practicing another embodiment of a process for preparing an organic film according to the present invention.

For example, when a gaseous organic material is used to form a thin film, it is not required to heat the material. An example of an apparatus adapted to prepare an organic film from such gaseous material is shown in FIG. 13. Parts of the apparatus of FIG. 13 having the same functions as those of the apparatus shown in FIGS. 1 and 2 are designated by like reference numerals. The apparatus of FIG. 13 includes a crucible 13 and a gas intake pipe 92 connected at one end thereof to the crucible 13 through a leak valve 91 and at the outer end thereof to a bomb charged with an organic gas material. The intake pipe 92 acts to introduce the gas of a pressure higher than, preferably of at least $10^2$ times as high as a pressure within a bell jar 82. The organic gas, at the time of the ejection from an injection nozzle 12, is supercooled due to adiabatic expansion to form clusters, so that an organic film may be formed on the surface of a substrate 41 in the substantially same manner as in the solid organic material as explained hereinbefore. In this case, one of factors importantly affecting formation of the organic film is a configuration of the injection nozzle 12. More particularly, it is essential not only to keep a pressure difference between the interior of the crucible 13 and the exterior thereof at a predetermined level but to determine the diameter and thickness of the injection nozzle in the substantially same manner as in FIG. 1 so as to meet requiremets for the formation of clusters at the time of the injection therefrom.

Also, in the present embodiment, formation of the injection nozzle 12 into a suitable configuration allows the nozzle to be provided directly at the upper end of the intake pipe 92 projecting into the bell jar 82 without interposing the crucible 13 therebetween.

The process of the present invention constructed in the manner as described hereinbefore may be further constructed to alternately conduct the ionization and the interruption of ionization in the ionization chamber 20.

As can be seen from the foregoing, the process of the present invention is constructed to eject an organic material vaporized by heating or supplied in a gaseous state from the injection nozzle into the high vacuum region at a pressure of at least $10^2$ times as high as that of the vacuum region to form at least a part of the organic material into clusters comprising atoms thereof and impinge the clusters on the substrate with kinetic energy imparted to the clusters at the time of the injection from the nozzle or kinetic energy imparted thereto by ionizing a part of the clusters and accelerating the ionized clusters by an electric field, to thereby form an organic thin film on the substrate.

Also, it will be understood that the process of the present invention is capable of controlling the conditions for vaporization, the degree of ionization and/or an energy for accelerating the ionized clusters to allow an intermediate state of the clusters necessary for forming polymers from monomers by polymerization and/or polycondensation to appear due to abstraction, breaking, cleavage, recombination and the like occurring in a part of atoms forming the clusters to promote effective polymerization and/or polycondensation reactions on the substrate, to thereby form and organic film of a good quality. Also, the present invention is capable of accomplishing the formation of an organic film in a vacuum atmosphere different from the conventional methods such as a plasma method and the like, to thereby effectively prevent the inclusion of impurities into a film during the formation to ensure the formation of a film with a good quality.

The present invention has a further advantage of readily forming an organic film of a high quality which could not substantially prepared according to the conventional deposition method and plasma method. Also, the present invention is capable of forming a film having physical and chemical properties controlled as desired, so that it may be used to prepare a film for an organic semiconductor.

Furthermore, the present invention is capable of varying kinetic energy imparted to clusters formed, to thereby allow an organic film formed of the clusters to have a large bonding strength with respect to a substrate.

Obviously many modifications and variations of the present invention are possible in the light of the above teachings. It is therefore to be understood that within the scope of the appended claims the invention may be practiced otherwise than as specifically described.

What is claimed as new and desired to be secured by Letters Patent of the United States is:

1. A process for preparing an organic film comprising:
   (a) heating an organic material in a closed crucible having at least one injection nozzle, thereby vaporizing said organic material;
   (b) injecting said vapor through said nozzle into a vacuum region to adiabatically expand said vapor so as to attain a supercooled state to form aggregated clusters of molecules of said vaporized organic material;
   (c) ionizing at least part of said clusters by irradiating said clusters with electron beams of several tens to about 300 volts with no more than about 100 mA, whereby a vapor stream containing ionized and unionized clusters is produced;
   (d) subjecting atoms forming said molecules of vaporized organic material in said vapor stream to abstraction, breakage, cleavage or recombination or a combination thereof by kinetic energy imparted to said vaporized organic material, thereby forming an intermediate state for forming an organic film; and (e) impinging said vapor stream containing ionized and unionized clusters on a substrate surface, thereby forming an organic film on said substrate.

2. The process according to claim 1, wherein the pressure of said vacuum region receiving said injected vapor is one-hundredth the pressure in said crucible.

3. The process according to claim 1, wherein said vapor stream is accelerated by an electric field.

4. The process of claim 3, wherein said vapor stream is accelerated at 100 volts–500 volts.

5. The process according to claim 1, wherein said substrate is maintained in a cooled state.

6. The process according to claim 1, wherein said vaporized organic material in said vapor stream is converted to the intermediate state by the kinetic energy at the time of injecting said organic material through said nozzle.

7. The process according to claim 1, wherein said vaporized organic material in said vapor stream is converted to the intermediate state by the kinetic energy at the time of ionizing said clusters and accelerating said vapor stream by an electric field.

8. The process according to claim 1, wherein said organic material is anthracene.

9. The process according to claim 1, wherein said aggregated clusters of molecules comprise about 5 to 200 molecules per cluster.

10. The process according to claim 1, wherein said injection nozzle has a diameter of 0.5–2.0 mm.

11. The process according to claim 1, wherein said vacuum region around the crucible has a pressure of about $10^{-7}$ to $10^{-3}$ torr.

12. The process according to claim 1, wherein said closed crucible has an internal vapor pressure of about $10^{-1}$ to 10 ton.

* * * * *